US00RE44156E

(19) United States
(12) Reissued Patent
Chen et al.

(10) Patent Number: US RE44,156 E
(45) Date of Reissued Patent: Apr. 16, 2013

(54) METHOD FOR FORMING SINGLE-LEVEL ELECTRICALLY ERASABLE AND PROGRAMMABLE READ ONLY MEMORY OPERATED IN ENVIRONMENT WITH HIGH/LOW-VOLTAGE

(75) Inventors: Rong-Ching Chen, Taichung (TW); Ching-Chun Huang, Taichung (TW); Jy-Hwang Lin, Taichung (TW)

(73) Assignee: United Microelectronics Corp., Hsin-Chu (TW)

(21) Appl. No.: 11/391,667

(22) Filed: Mar. 29, 2006

Related U.S. Patent Documents

Reissue of:

(64) Patent No.: 6,900,097
Issued: May 31, 2005
Appl. No.: 10/435,018
Filed: May 12, 2003

(51) Int. Cl.
*H01L 21/02* (2006.01)
*H01L 21/336* (2006.01)

(52) U.S. Cl.
USPC ..... 438/257; 257/318; 257/E21.179; 257/E21.422; 257/E21.694; 257/E21.689; 438/258; 438/261; 438/275; 438/526; 438/981

(58) Field of Classification Search ..... 257/318, 257/E21.179, E21.422, E21.689, E21.694; 438/165, 257, 258, 261, 275, 370, 514, 526, 438/911, 981; 365/185.01, 185.02, 185.03, 365/185.05, 185.06, 185.1, 185.11, 185.17, 365/185.21, 185.22
See application file for complete search history.

(56) References Cited

U.S. PATENT DOCUMENTS

| | | | | | |
|---|---|---|---|---|---|
| 4,240,092 | A | * | 12/1980 | Kuo | 257/296 |
| 4,477,825 | A | | 10/1984 | Yaron et al. | |
| 4,686,652 | A | * | 8/1987 | Spence | 365/185.25 |
| 5,198,380 | A | * | 3/1993 | Harari | 438/257 |
| 5,254,489 | A | * | 10/1993 | Nakata | 438/258 |
| 5,268,319 | A | * | 12/1993 | Harari | 438/260 |
| 5,451,535 | A | * | 9/1995 | Chan et al. | 438/261 |
| 5,497,021 | A | * | 3/1996 | Tada | 257/369 |
| 5,576,573 | A | * | 11/1996 | Su et al. | 257/391 |
| 5,723,355 | A | * | 3/1998 | Chang et al. | 438/275 |
| 5,850,092 | A | * | 12/1998 | Cappelletti | 257/321 |
| 5,856,221 | A | * | 1/1999 | Clementi et al. | 438/258 |
| 5,913,120 | A | * | 6/1999 | Cappelletti | 438/257 |
| 6,004,847 | A | * | 12/1999 | Clementi et al. | 438/258 |
| 6,040,019 | A | * | 3/2000 | Ishida et al. | 427/526 |
| 6,104,059 | A | * | 8/2000 | Ono | 257/320 |
| 6,159,799 | A | * | 12/2000 | Yu | 438/257 |
| 6,162,683 | A | * | 12/2000 | Chen | 438/258 |

(Continued)

*Primary Examiner* — Harry W Byrne
(74) *Attorney, Agent, or Firm* — Stout, Uxa, Buyan & Mullins, LLP

(57) ABSTRACT

First of all, a semiconductor substrate is provided, and then a first/second wells with a first conductivity are formed therein so as to individually form a first part of the floating gate of single-level EEPROM and a low-voltage device thereon, wherein the first and the second wells are used to separate the high-voltage device, and the depth of the first well is the same as the second well. Furthermore, the high-voltage device and the second part of the floating gate of single-level EEPROM are individually formed on the semiconductor substrate between the first and the second wells, and the control gate of the floating gate of single-level EEPROM is formed in the third well located under the second part of the floating gate of single-level EEPROM, wherein the high-voltage device can be operated in the opposite electric field about 18V, such as −6V~12V, −12V~6V, −9V~9V etc.

9 Claims, 10 Drawing Sheets

(New)

U.S. PATENT DOCUMENTS

| | | | | |
|---|---|---|---|---|
| 6,184,093 | B1 * | 2/2001 | Sung | 438/275 |
| 6,225,167 | B1 * | 5/2001 | Yu et al. | 438/275 |
| 6,232,182 | B1 * | 5/2001 | Sugaya | 438/258 |
| 6,248,630 | B1 * | 6/2001 | Clementi et al. | 438/258 |
| 6,259,133 | B1 * | 7/2001 | Gardner et al. | 257/315 |
| 6,281,077 | B1 * | 8/2001 | Patelmo et al. | 438/258 |
| 6,281,089 | B1 * | 8/2001 | Chen | 438/315 |
| 6,319,780 | B2 * | 11/2001 | Crivelli et al. | 438/275 |
| 6,399,442 | B1 * | 6/2002 | Baldi et al. | 438/258 |
| 6,399,443 | B1 * | 6/2002 | Chwa et al. | 438/258 |
| 6,417,044 | B1 * | 7/2002 | Ono | 438/241 |
| 6,417,051 | B1 * | 7/2002 | Takebuchi | 438/287 |
| 6,429,073 | B1 * | 8/2002 | Furuhata et al. | 438/258 |
| 6,455,374 | B1 * | 9/2002 | Lee et al. | 438/257 |
| 6,503,800 | B2 * | 1/2003 | Toda et al. | 438/279 |
| 6,522,587 | B1 * | 2/2003 | Furuhata et al. | 365/185.28 |
| 6,534,363 | B2 * | 3/2003 | Kim | 438/258 |
| 6,709,920 | B2 * | 3/2004 | Boo et al. | 438/257 |
| 6,784,115 | B1 * | 8/2004 | Ni et al. | 438/770 |
| 6,790,727 | B2 * | 9/2004 | Jones et al. | 438/257 |
| 6,818,509 | B2 * | 11/2004 | Park et al. | 438/258 |
| 2002/0190310 | A1 * | 12/2002 | Boivin | 257/318 |
| 2003/0022447 | A1 * | 1/2003 | Park et al. | 438/257 |
| 2003/0218920 | A1 * | 11/2003 | Harari | 365/200 |
| 2004/0198000 | A1 * | 10/2004 | Chen et al. | 438/275 |

* cited by examiner (Amended)

(Amended)

(Amended)

(Amended)

(New)

(Amended)

(Amended)

(Amended)

METHOD FOR FORMING SINGLE-LEVEL ELECTRICALLY ERASABLE AND PROGRAMMABLE READ ONLY MEMORY OPERATED IN ENVIRONMENT WITH HIGH/LOW-VOLTAGE

Matter enclosed in heavy brackets [ ] appears in the original patent but forms no part of this reissue specification; matter printed in italics indicates the additions made by reissue.

*CROSS-REFERENCE TO RELATED APPLICATIONS*

*This application is a reissue of U.S. application Ser. No. 10/435,018, filed on May 12, 2003 (now U.S. Pat. No. 6,900,097). Furthermore, U.S. application Ser. No. 12/789,364, filed on May 27, 2010 is a divisional application of this reissue application.*

BACKGROUND OF THE INVENTION

1. Field of the Invention

The present invention relates generally to a electrically erasable and programmable read only memory (single-level EEPROM), and more particularly to a single-level electrically erasable and programmable read only memory (single-level EEPROM) operated in environment with high/low-voltage.

2. Description of the Prior Art

As semiconductor devices, such as the Metal-Oxide-Semiconductor device, become highly integrated the area occupied by the device shrinks, as well as the design rule. With advances in the semiconductor technology, the dimensions of the integrated circuit (IC) devices have shrunk to the deep sub-micron range. When the semiconductor device continuously shrinks in the deep sub-micron region, some problems described below are incurred due to the scaling down process. To meet customer demand for small size and low power products, manufacturers are producing newer integrated circuits (ICs) that operate with various supply voltages and that include smaller internal sub-circuits. Many ICs, such as memory circuits or other circuits such as microprocessors that include onboard memory, include one or more Electrically erasable and programmable read only memory(EEPROM)cells for data storage.

Electrically erasable and programmable read only memory (EEPROM) is currently one the most widely used memory devices applied in personal computers and electronic equipment. A memory cell in an early developed conventional EEPROM comprises a transistor with a floating gate to achieve the operations of writing, erasing, and storing data while electrical shut down. This conventional memory cell typically occupies a large surface area and the data access speed is between 150 ns to 200 ns, but the lately developed memory cell has a faster data access speed ranged between 70 ns to 80 ns. While storing data, a high voltage of 8V is applied between the drain region and the source region. Meanwhile, the controlling gate is biased with the same high voltage. The hot electrons thus flow out of the source region and toward the drain region. While approaching the drain region, these hot electrons tunnel through the oxide layer and are trapped in the floating gate. This is known as the drain side injection operation. By applying a positive voltage to the source region and a negative voltage to the controlling gate, the electrons trapped in the floating gate flow out of the floating gate and tunnel through the oxide layer. Thus the stored data are erased and the floating gate is retrieved to the status before data storing.

In general, conventional electrically erasable programmable read only memory (EEPROM) is a double-level electrically erasable programmable read only memory device with two poly-gate that utilizes dual field effect transistors (FET)to control current flow through a channel region between source and drain regions. This double-level EEPROM includes: a floating gate, formed from a first layer of polycrystalline silicon, overlays the channel region; a control gate, formed from a second layer of polycrystalline silicon, overlays the floating gate. To read the memory cell, the control gate is typically charged to draw electrons into the channel and to permit current flow. However, this effect may be blocked by the floating gate positioned between the channel and the control gate. The floating gate influences the current flow in the channel as a function of the charge trapped on the floating gate. This double-level EEPROM cell is programmed by tunneling charge carriers on or off the floating gate with suitably applied electric fields that act across thin oxide layers; the size and thickness of the thin oxide layers are critically important to proper operation of the device. More introduction of double-level EEPROM cell can be acquired by referring to U.S. Pat No. 4,477,825, issued Oct. 16, 1984 disclosed by Yaron et al.

Recently, another electrically erasable programmable read only memory (EEPROM) has been developed to form a single-level electrically erasable programmable read only memory device with one poly-gate. Single-level EEPROM is widely used as nonvolatile memory for embedded applications in CMOS logic and mixed signal circuits. In a single-level EEPROM device, both the floating gate and the control gate function are performed by a single polycrystalline silicon layer. In general, the floating gate function and the control gate function are performed by different areas of the single poly layer. Capacitive coupling between the floating gate and the control gate is used to transfer a switch voltage from the control gate to the floating gate so as to permit the write/erase operation of the floating gate. On the other hand, the single-level EEPROM cell is fully compatible with standard single poly CMOS processes. The conventional single-level EEPROM cell comprises: an n-well served as a control gate for the EEPROM cell; a floating gate which is formed from a polysilicon layer, wherein the control gate is capacitively coupled to the floating gate; a p+ region in the n-well near the edge of the floating gate is shorted with a n+ well contact. This allows the n-well surface beneath the floating gate to be easily inverted during programming operation. The n-channel transistor is used for the read operation and its threshold voltage is modulated by the presence or absence of electron charge on the floating gate. By this method, digital information can be stored in the single-level EEPROM cell. Furthermore, single-level EEPROM cell can be programmed, that is, electrons injected onto the floating gate, using the well known channel hot electron (CHE) injection by applying approximately 10-12 volts at the control gate (Vcg) and approximately 6 volts at the drain of the n-channel transistor. After programming, the threshold voltage of the memory cell is increased from about 1 to 3 volts to over 7 volts. Thus, for read operation, by applying 5 volts on the control gate and approximately 1 volt at the drain, the cell is either "off" or "on" representing the digital information "0" or "1", respectively.

Recently, in the circuit design rule for, the requirement for utilizing the relatively electric-field with a wide range is increased day by day, that is, the circuit design rule for utilizing the relatively positive and negative voltages with a wide range is more and more necessary. For example of Thin-Film Transistor Liquid-Crystal Display (TFT-LCD) or Super-Twisted Nematic Liquid Crystal Display (STN-LCD), if the positive and negative voltages with a wide range can be provided to operate the drivers thereof, various colors and brightness will be generated. However, the common process for forming the single-level EEPROM as well known belongs to the twin-well process, and this single-level EEPROM is only utilized in designated field so that it is difficult to develop widely. The main reason is that the MOS device operated in environment with high voltage can not be embedded on the twin-well process for forming the single-level EEPROM. Therefore, it is necessary that another circuitry is additionally designed in the prior art so as to control or convert operation between positive and negative voltages, whereby the positive voltage is inputted into the conventional circuitry first, and another circuitry converts it into the negative voltage to output. Accordingly, disadvantages are not only complex process for forming this prior circuitry, but also high power consumption and large in size for design applications. The main difficulty is that the single-level EEPROM cell for operating in environment with relatively positive and negative voltages can not be fabricated by the conventional process. In accordance with the above description, a new and improved process and the structure thereof of the single-level EEPROM for operating in environment with relatively positive and negative voltages is therefore necessary in the deep sub-micron technology of semiconductors, so as to raise the performance of the single-level EEPROM.

SUMMARY OF THE INVENTION

In accordance with the present invention, a method for forming single-level electrically erasable and programmable read only memory (single-level EEPROM) operated in environment with high/low-voltage is provided that substantially overcomes the drawbacks of the above mentioned problems of EEPROM.

Accordingly, it is one of objects in the present invention to provide a single-level EEPROM process for fabricating the single-level EEPROM operated in environment with high/low-voltage. This invention can utilize formation of tri-well to embed the single-level EEPROM therein, wherein the tri-well comprises an N-well, a P-well and a deep N-well. Furthermore, the present invention constructs the low-voltage device in a deep N-well, the floating gate of the single-level EEPROM on another deep N-well and the control gate of the single-level EEPROM in the N-well located nearby the deep N-well. Accordingly, the single-level EEPROM can be operated in environment with low-voltage and high-voltage area with positive/negative voltage. Therefore, this invention can simultaneously fabricate single-level EEPROM and the high/low voltage devices thereof, so this invention can reduce the complication and costs in the conventional process to correspond to economic effect.

Another object of the present invention is to provide a single-level EEPROM process for fabricating the single-level EEPROM operated in environment with high/low-voltage. The single-level EEPROM of the present invention can be operated in the opposite electric field with wide range, wherein the high-voltage range utilized in the present invention is about 18V, such as −6V~12V, −12V~6V, −9V~9V etc. Furthermore, the devices fabricated by this invention can simultaneously input and output the positive/negative voltages without transforming voltage state, so this invention can support more diverse application field for the devices or products that need the positive/negative voltages to operate.

In accordance with the purposes of the present invention, a single-level EEPROM process for fabricating the single-level EEPROM operated in environment with high/low-voltage is provided. First of all, a semiconductor substrate is provided, and then a first/second wells with a first conductivity are formed therein so as to individually form a first part of the floating gate of single-level EEPROM and a low-voltage device thereon, wherein the first and the second wells are used to separate the high-voltage device, and the depth of the first well is the same as the second well. Furthermore, the high-voltage device and the second part of the floating gate of single-level EEPROM are individually formed on the semiconductor substrate between the first and the second wells, and the control gate of the floating gate of single-level EEPROM is formed in the third well located under the second part of the floating gate of single-level EEPROM, wherein the high-voltage device can be operated in the opposite electric field about 18V, such as −6V~12V, −12V~6V, −9V~9V etc.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

These preferred embodiments of the present invention are now described in greater detail. Nevertheless, it should be recognized that the present invention can be practiced in a wide range of other embodiments besides those explicitly described, and the scope of the present invention is expressly not limited except as specified in the accompanying claims.

Figure 1A:
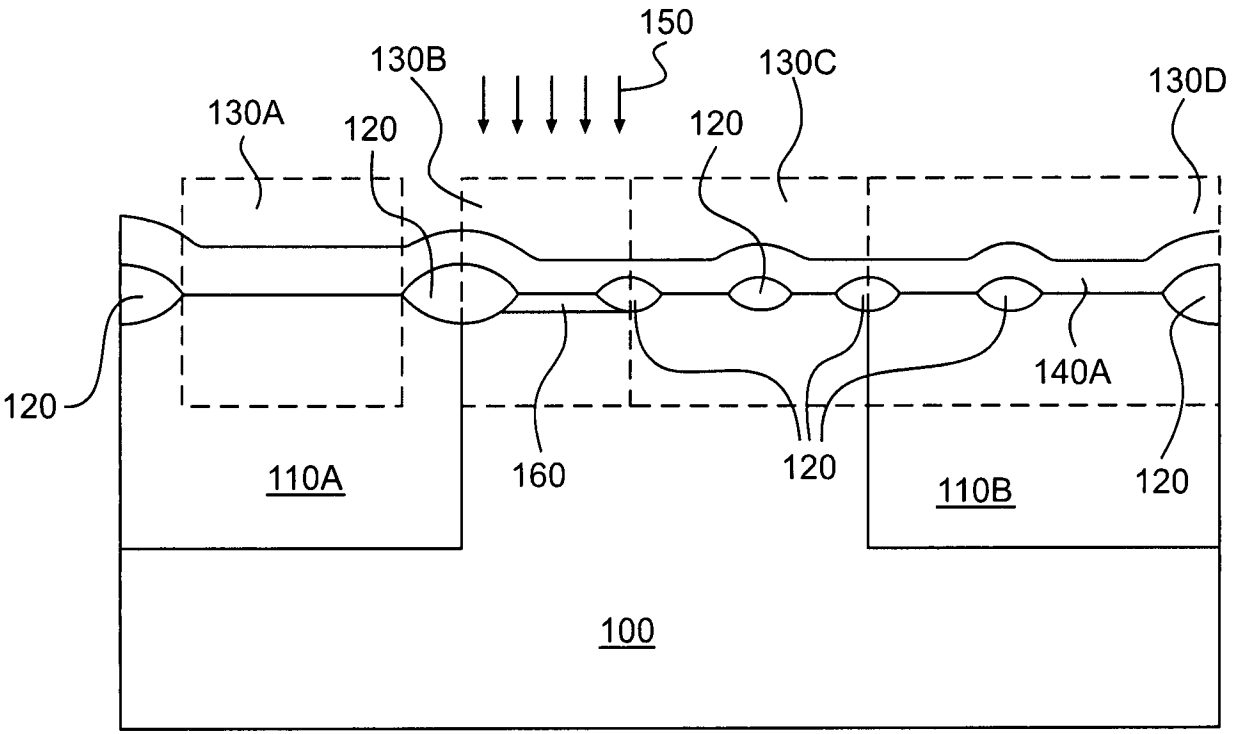
FIG. 1A to FIG. [1D] *1F* show the process stages for fabricating the single-level EEPROM operated in environment with high/low-voltage in accordance with the first embodiment of the present invention.
Figure 1B:
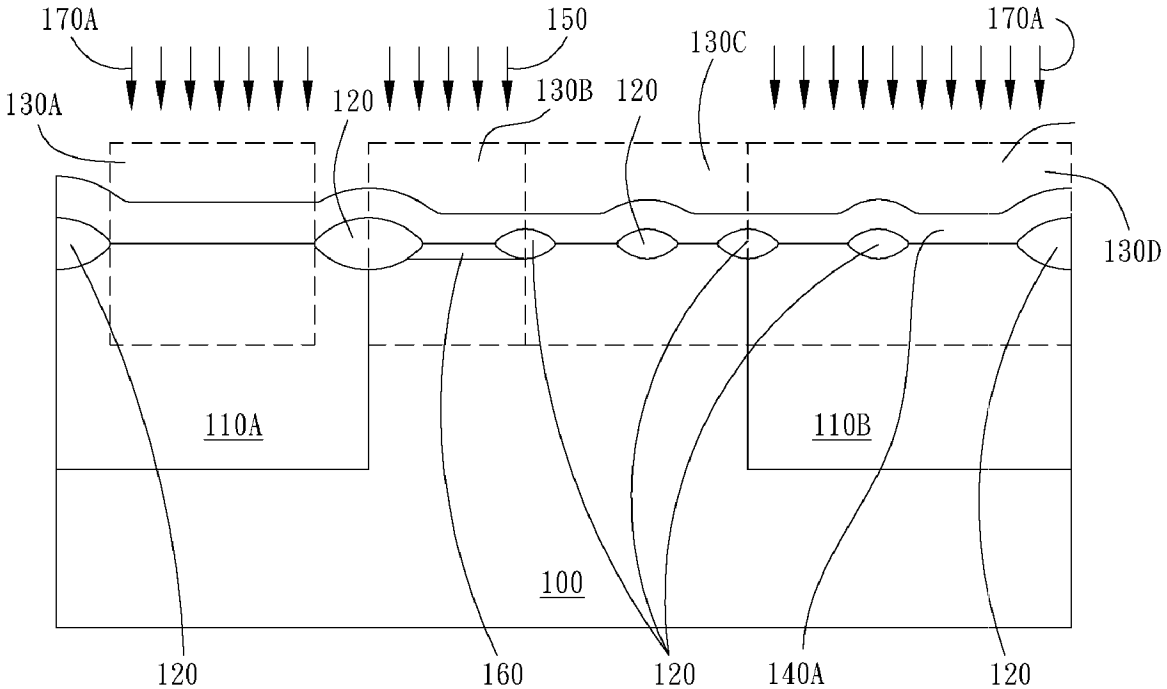
Figure 1C:
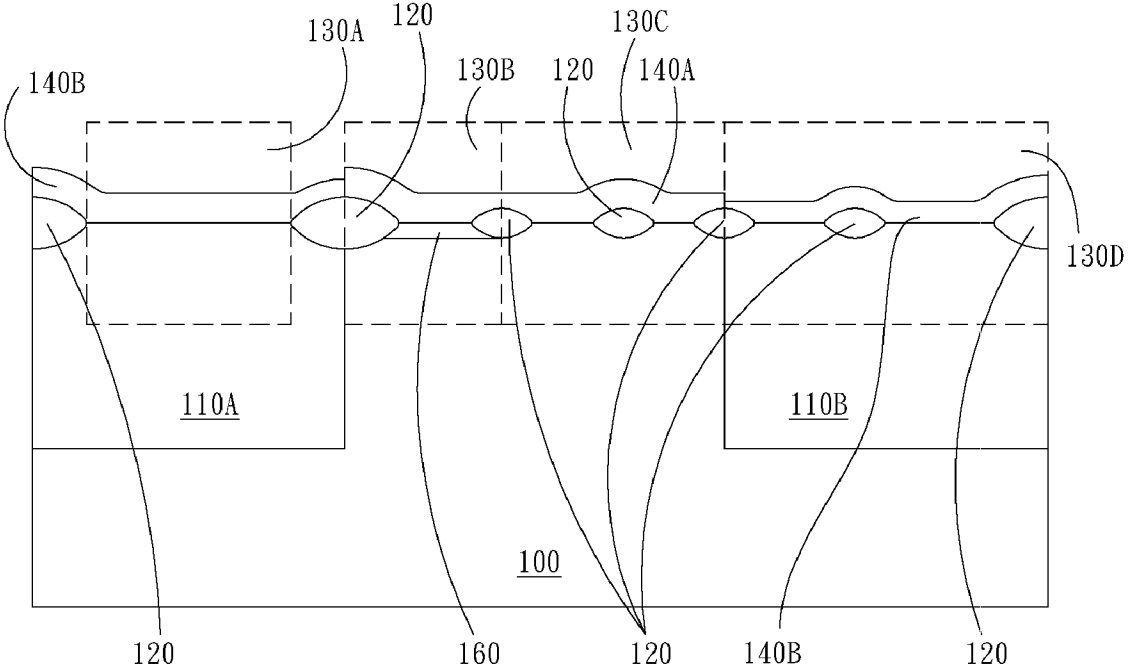
Figure 1D:
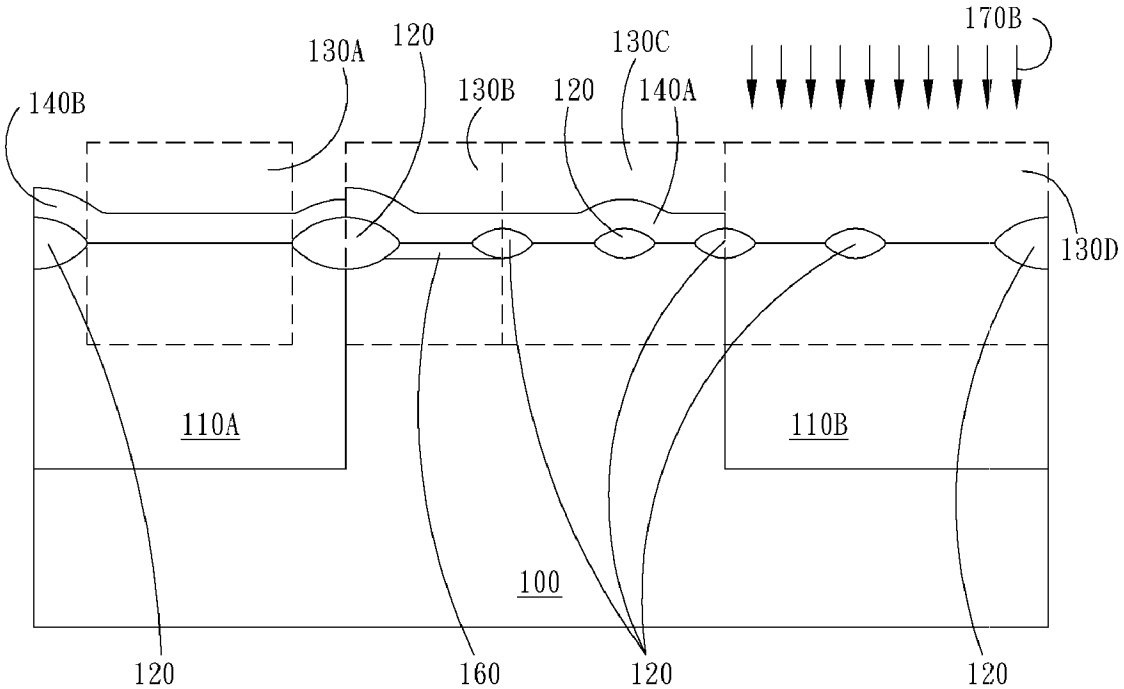
Figure 1E:
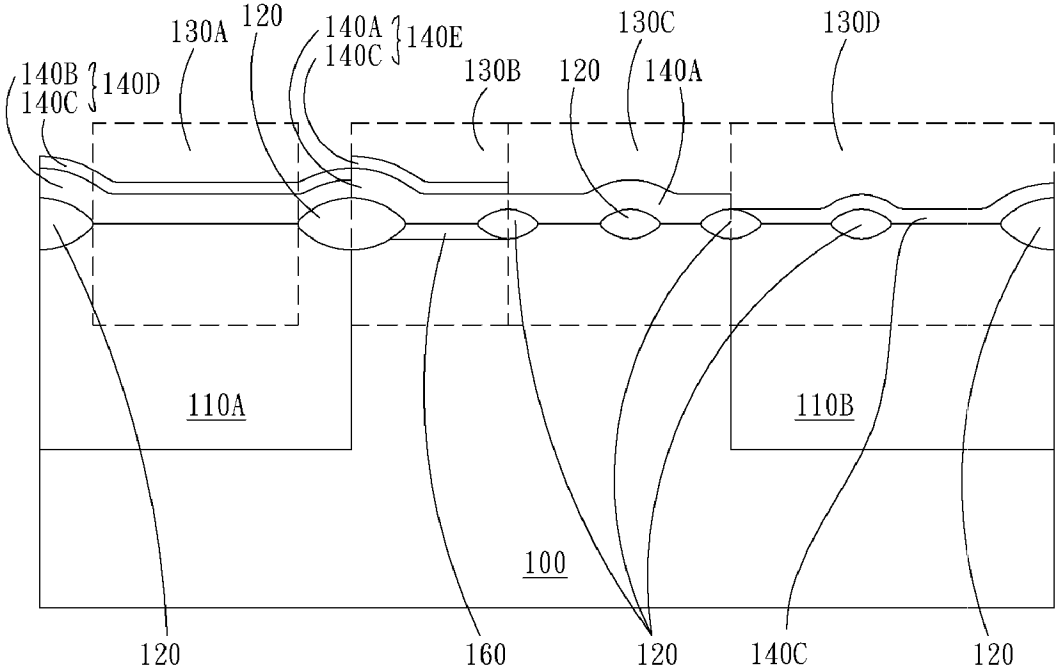
Figure 1F:
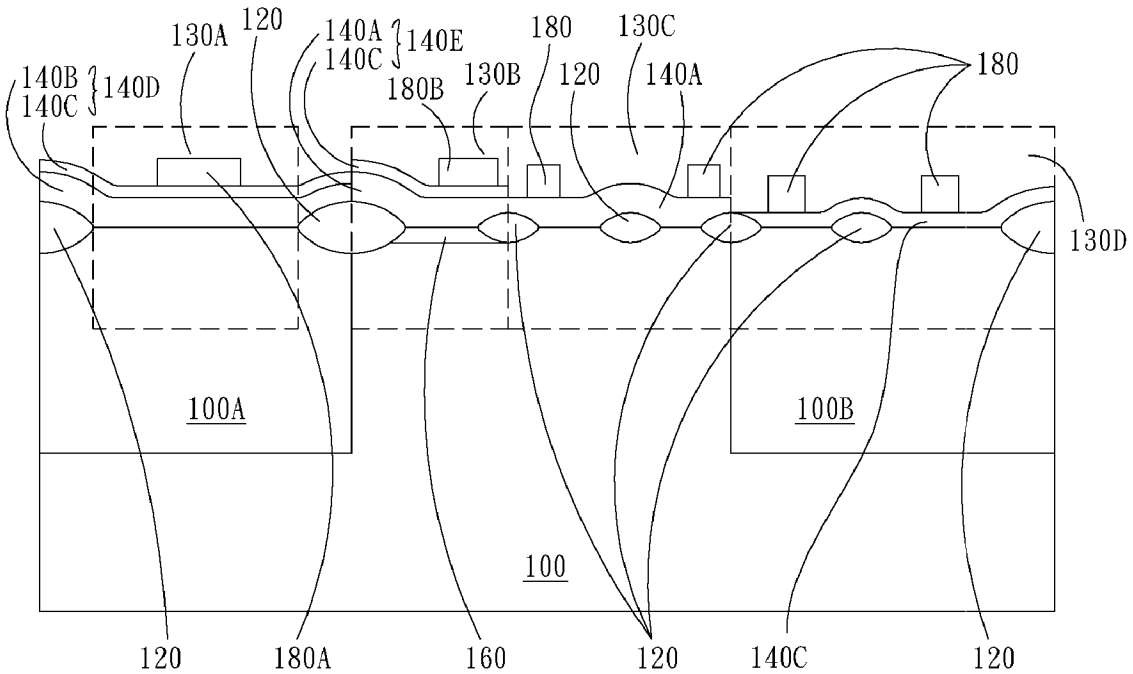

As illustrated in FIG. 1A to FIG. [1E] *1F*, in the first embodiment of the present invention, first of all, a semiconductor substrate 100 having a first well [100A] *110A* and a second well [100B] *110B* is provided, and then a plurality of isolation regions 120 are formed and defined in the semiconductor substrate 100, as shown in FIG. 1A, and simultaneously a first device region 130A is formed in the first well [100A] *110A*, a second device region 130B is formed beside the first well [100A] *110A*, a third device region 130C is formed between the second well [100B] *110B* and the second device region 130B and a fourth device region 130D is formed in the second well [100B] *110B*. Afterward, a first dielectric layer 140A having a first thickness is formed on the semiconductor substrate 100, wherein the first dielectric layer 140A is a high-voltage dielectric layer. Then an ion-implanting process 150 is performed to form a control gate 160 of the single-level EEPROM in the second device region 130B under the first dielectric layer 140A. Subsequently, *as* shown in FIG. 1B, a first etching process 170A is performed to remove [a part of] the first dielectric layer 140A located on the semiconductor substrate 100 of the first well [100A] *110A* and the second well [100B] *110B*, and then, *as shown in FIG. 1C,* a second dielectric layer 140B having a second thickness is formed on the partial semiconductor substrate 100 located on the first well [100A] *110A* and the second well [100B] *110B*, wherein the second thickness is about less than the first thickness. Next, *as* shown in FIG. [1C] *1D*, a second etching process 170B is performed to remove [a part of] the second dielectric layer 140B located on the fourth device region 130D [to form the dielectric layer 140B, as]. *As* shown in FIG. [1D] *1E*, a third dielectric layer 140C having a third thickness is formed on the first device region 130A, the second device region 130B and the fourth device region 130D, wherein the third dielectric layer 140C is a low-voltage dielectric layer, and the third thickness is about less than the second thickness; and further, the third dielectric layer 140C and the second dielectric layer 140B are stacked from each other to form a fourth dielectric layer 140D having a fourth thickness on the first device region 130A; and further, the third dielectric layer 140C and the first dielectric layer 140A are stacked from each other to form a fifth dielectric layer 140E having a fifth thickness on the second device region 130B. Accordingly, the fifth thickness of the fifth dielectric layer 140E on the second device region 130B is more than the first thickness of the first dielectric layer 140A on the third device region 130C; the first thickness of the first dielectric layer 140A on the third device region 130C is more than the fourth thickness of the fourth dielectric layer 140D on the first device region 130A; the fourth thickness of the fourth dielectric layer 140D on the first device region 130A is more than the third thickness of the third dielectric layer 140C on the fourth device region 130D. Then, *as* shown in FIG. [1E] *1F*, a plurality of gates 180 are individually formed and defined on these dielectric layers of the first device region 130A, the second device region 130B, the third device region 130C and the fourth device region 130D, wherein there is the same gate located on the first device region 130A and the second device region 130B, and this gate serves as the floating gate of the single-level EEPROM; especially, the first part 180A of the floating gate is located on the dielectric layer of the first device region 130A and the second part 180B of the floating gate is located on the dielectric layer of the second device region 130B. Accordingly, this invention can fabricate the single-level EEPROM operated in environment with high/low-voltage, wherein the third device region 130C can be operated in the opposite electric field about 18V, such as −6V *to* 12V, −12V *to* 6V, −9V *to* 9V etc. *The opposite electric field means the voltage difference between the highest voltage and the lowest voltage in which the third device region 130C can be operated.*

Figure 2A:
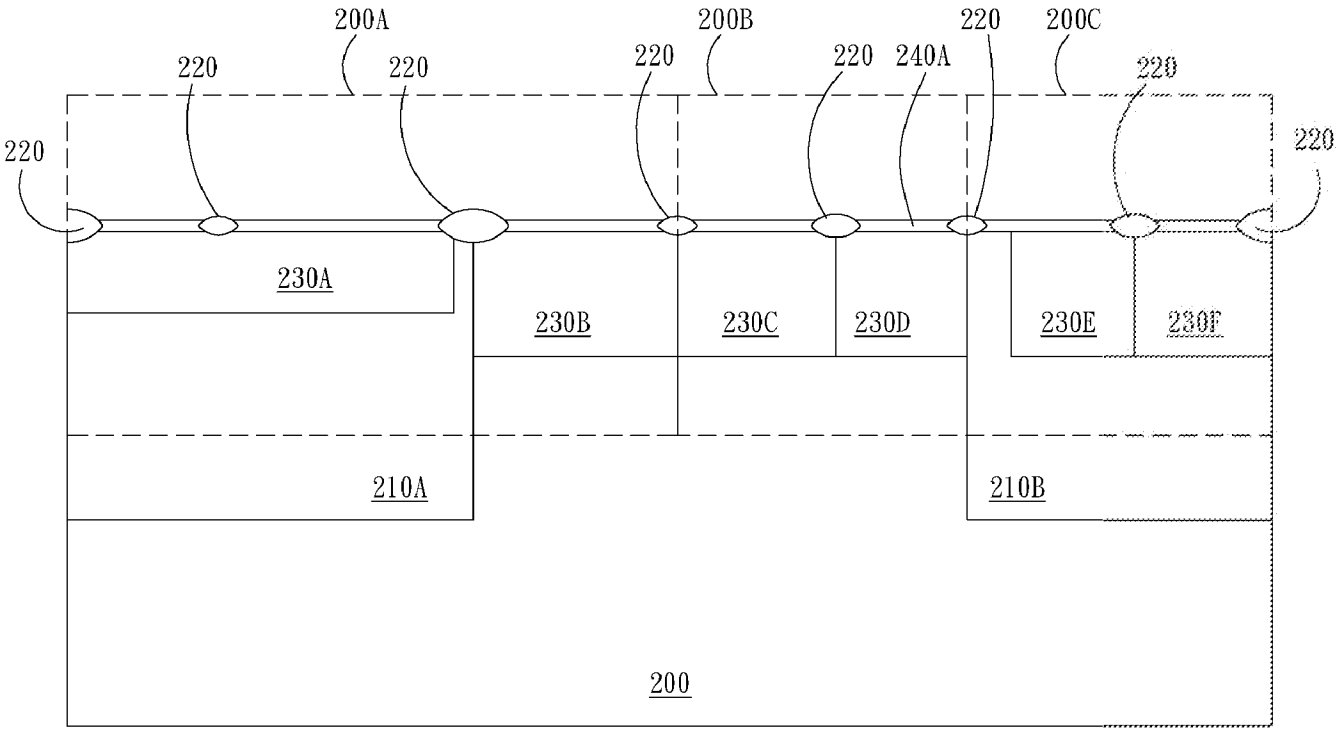
FIG. 2A to FIG. 2D show the process stages for fabricating the single-level EEPROM operated in environment with high/low-voltage in accordance with the second embodiment of the present invention.

As illustrated in FIG. 2A, in the second embodiment of the present invention, first of all, a semiconductor substrate 200 having a first conductivity is provided, wherein the first conductivity comprises P-type dopant. Then a first deep well 210A and a second deep well 210B is formed in the semiconductor substrate 200, wherein the first deep well 210A and the second deep well 210B have a second conductivity, such as N-type dopant. Afterward, a plurality of active regions are defined by conventional implanting process and the isolating process to form a plurality of isolating regions 220 and wells 230 in the semiconductor substrate 200, wherein a first well 230A having the first conductivity is formed in the first deep well 210A; a second well 230B having the second conductivity is formed in the adjacent region beside the first deep well 210A; a third well 230C having the first conductivity is formed in the adjacent region beside the second deep well 210B; a fourth well 230D having the second conductivity is formed in the adjacent region between the second deep well 210B and the third well 230C; a fifth well 230E having the first conductivity and the sixth well 230F having the second conductivity are formed in the second deep well 210B; and further, the first well 230A and the second well 230B are the single-level EEPROM device region 200A, and the third well 230C and the fourth well 230D are the high-voltage device region 200B, and the fifth well 230E and the sixth well 230F are the low-voltage device region 200C. Moreover, a plurality of isolating regions 220 are individually on the positions as shown in FIG. 2A, and these isolating regions 220 comprises field-oxide layer (FOX) Subsequently, a first dielectric layer 240A having a first thickness is formed on the semiconductor substrate 200, wherein the first dielectric layer 240A is a high-voltage dielectric layer, and the first thickness is about 200 Å to 600 Å.

Figure 2B:
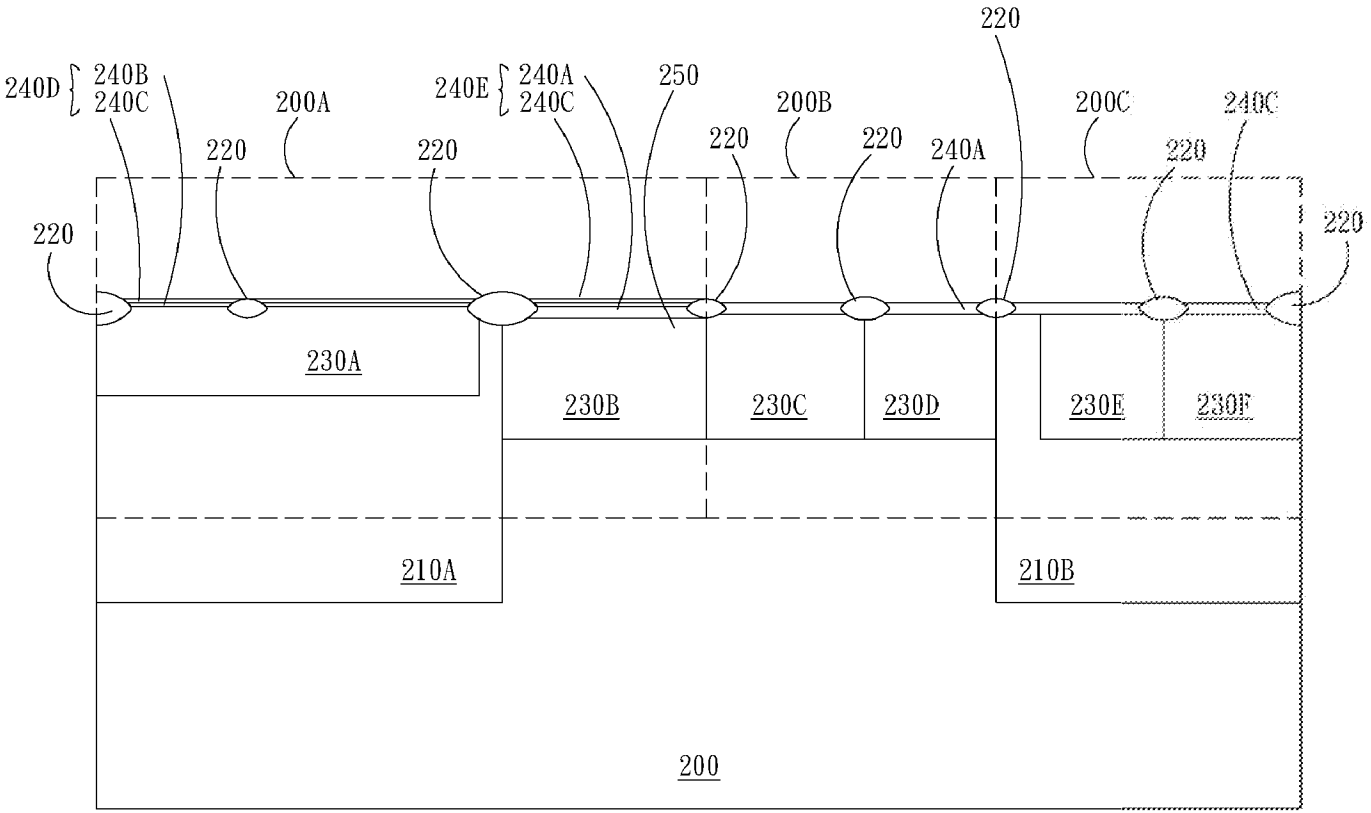

Referring to FIG. 2B, in this embodiment, a depletion layer 250 is formed in the second well 230B to reduce the resistances, wherein the depletion layer 250 is a doped region having the second conductivity, such as [n] $n^-$ dopant. Then sequentially establish the threshold voltage(Vt)of the single-level EEPROM in the first well 230A and the threshold voltage (Vt) of the high-voltage device in the third well 230C and the fourth well 230D. Afterward, [partial] first dielectric layer 240A located on the semiconductor substrate 200 of the first deep well 210A and the second deep well 210B is removed, and then a second dielectric layer 240B having a second thickness is formed on the [partial] semiconductor substrate 200 located on the first well 210A and the second well 210B, wherein the second thickness is about 60 Å to 80 Å. Subsequently, [partial] second dielectric layer 240B located on the second deep well 210B is removed, and then a third dielectric layer 240C having a third thickness is formed on the first deep well 210A, the second well 230B and the second deep well 210B, wherein the third dielectric layer 240C is a low-voltage dielectric layer, and the third thickness is about 50 Å to 70 Å; and further, the third dielectric layer 240C and the second dielectric layer 240B are stacked from each other to form a fourth dielectric layer 240D having a fourth thickness on the first deep well 210A; and further, the third dielectric layer 240C and the first dielectric layer 240A are stacked from each other to form a fifth dielectric layer 240E having a fifth thickness on the second well 230B. Accordingly, the fifth thickness of the fifth dielectric layer 240E on the second well 230B is more than the first thickness of the first dielectric layer 240A on the second device region 200B; the first thickness of the first dielectric layer 240A on the second device region 200B is more than the fourth thickness of the fourth dielectric layer 240D on the first deep well 210A; the fourth thickness of the fourth dielectric layer 240D on the first deep well 240C is more than the third thickness of the third dielectric layer 240C on the second deep well 210B.

Figure 2C:
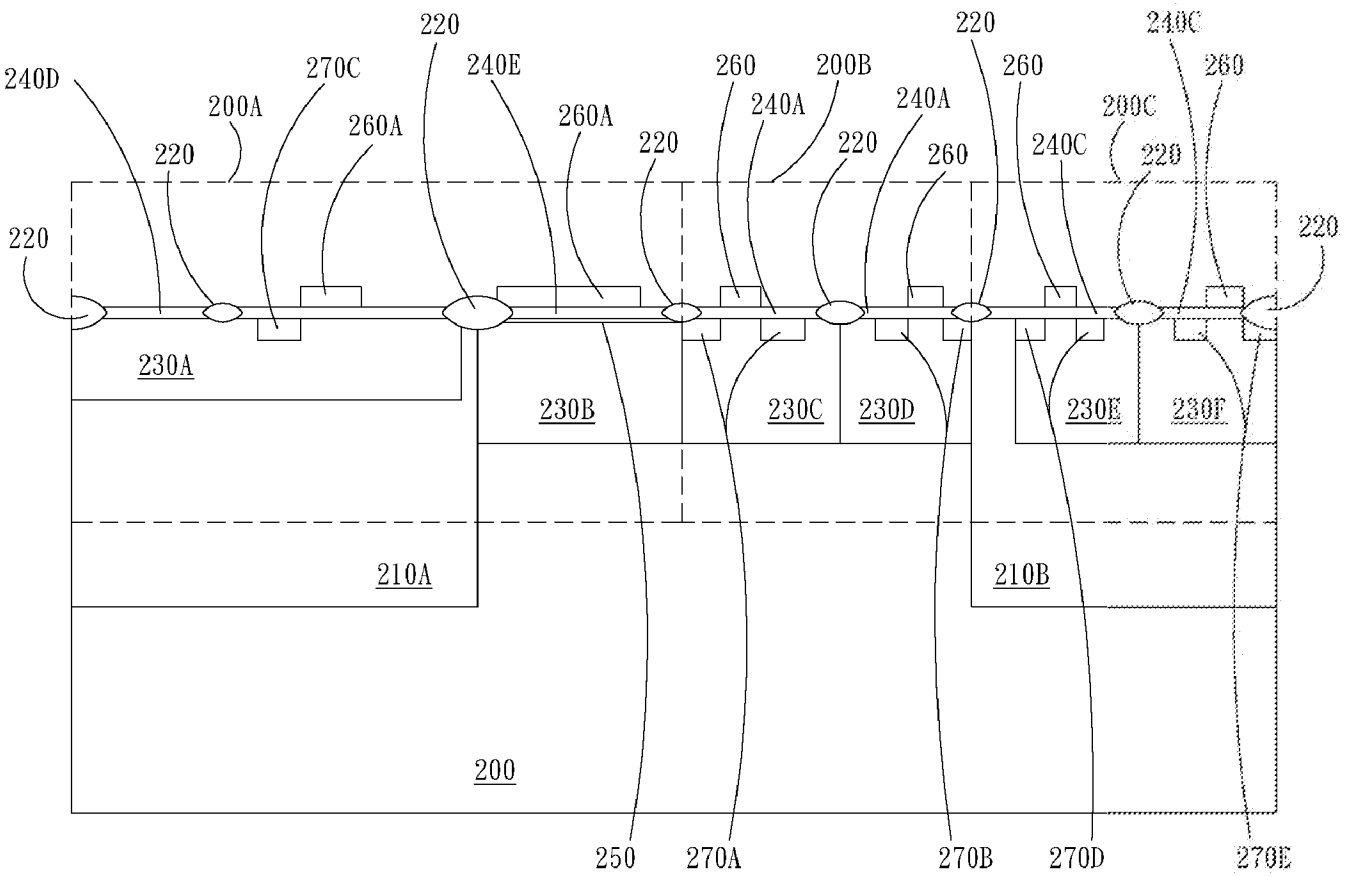
Figure 2D:
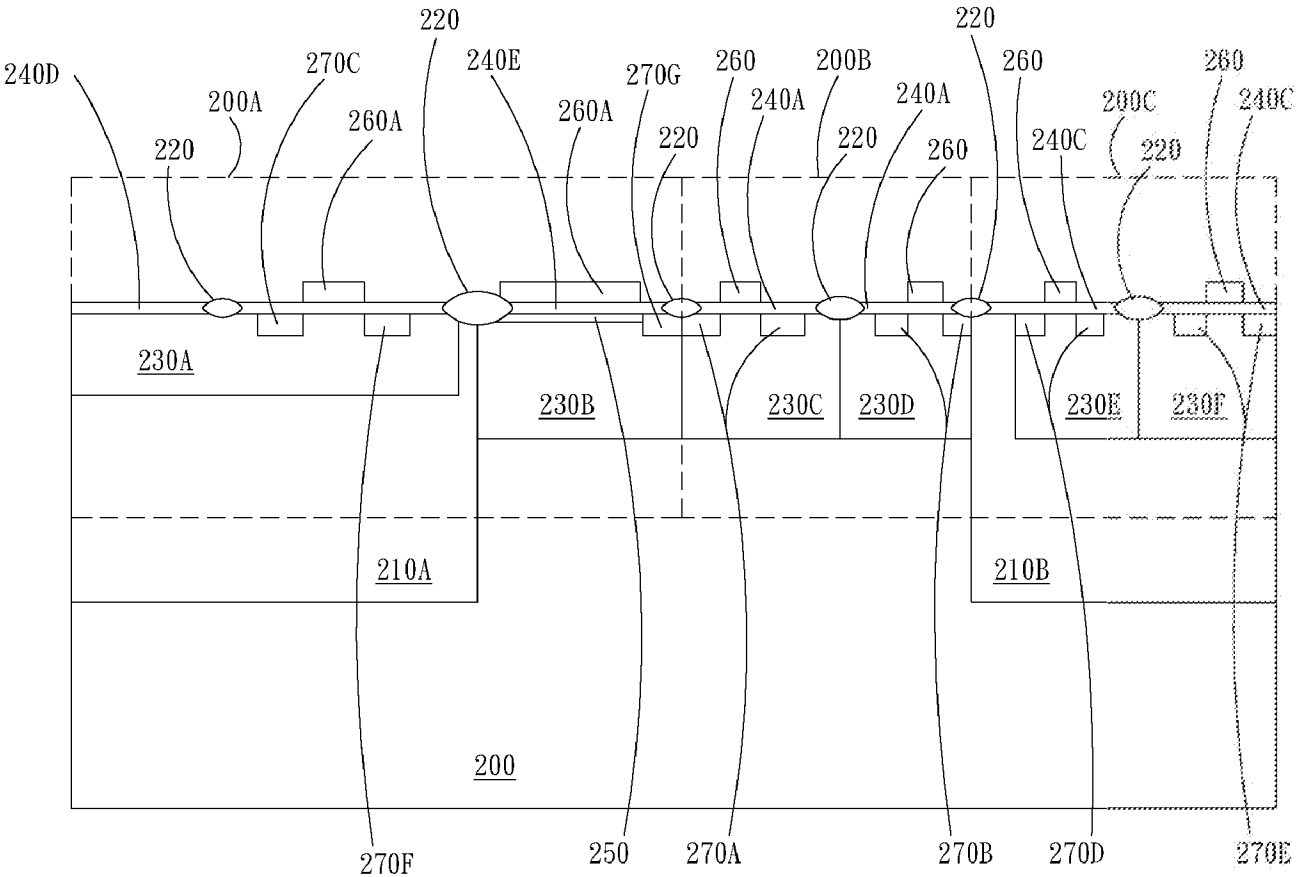

Referring to FIG. 2C, in this embodiment, a plurality of gates 260 are individually formed and defined on these dielectric layers of the first well 230A, the second well 230B, the third well 230C, the fourth well 230D, the fifth well 230E and the sixth well 230F, wherein there is the same gate located on the first well 230A and the second well 230B, and this gate serves as the floating gate 260A of the single-level EEPROM; especially, the first part of the floating gate 260A is located on the fourth dielectric layer 240D of the first well 230A and the second part of the floating gate 260A is located on the fifth dielectric layer 240E of the second well 230B. Then the first doped region 270A and the second doped region 270B are individually formed in the third well 230C and the fourth well 230D, wherein the first doped region 270A has the second conductivity, such as [$n^-$] *n* dopant, and the second doped region 270B has the first conductivity, such as [$p^-$] *p* dopant. Subsequently, the third doped region 270C is formed in the first well 230A under the first part of the floating gate 260A to define the source region of the floating gate 260A of the single-level EEPROM located under one side of the first part of the floating gate 260A, wherein the third doped region 270C has the second conductivity, such as [$n^-$] *n* dopant. Then the fourth doped region 270D and the fifth doped region 270E are individually formed in the fifth well 230E and the sixth well 230F, wherein the fourth doped region 270D has the second conductive, such as $n^-$ dopant; and the fifth doped region 270E has the first conductive, such as $p^-$ dopant. Next, the second doped region 270B in the fourth well 230D and the fifth doped region 270E in the sixth well 230F are heavy doped, wherein the heavy dopant comprises the first conductivity, such as $p^+$ dopant. Finally, the third doped region 270C in the first well 230A, the depletion layer 250 in the second well 230B, the first doped region 270A in the third well 230C and the fourth doped region 270D in the fifth well 230E are heavy doped, and a sixth doped region 270F is formed in the first well 230A [under] *beside* the first part of the floating gate 260A to define the drain region of the floating gate 260A [under] *and* the other side of the first part of the floating gate 260A, and a seventh doped region 270G is formed in the depletion layer 250 located [under] *beside* one side of the second part of the floating gate 260A to serve as the control gate of the single-level EEPROM such that this control gate is located in the second well 230B under the second part of the floating gate 260A, wherein the heavy dopant comprises the second conductivity, such as $n^+$ dopant. Accordingly, this invention can fabricate the single-level EEPROM operated in environment with high/low-voltage, wherein the high-voltage device region 200B can be operated in the opposite electric field about 18V, such as −6V~12V, −12V ~6V, −9V~9V etc.

In these embodiments of the present invention, as discussed above, this invention can utilize formation of tri-well to embed the single-level EEPROM therein, wherein the tri-well comprises an N-well, a P-well and a deep N-well. Furthermore, the present invention constructs the low-voltage device in a deep N-well, the floating gate of the single-level EEPROM on another deep N-well and the control gate of the single-level EEPROM in the N-well located nearby the deep N-well. Accordingly, the single-level EEPROM can be operated in environment with low-voltage and high-voltage area with positive/negative voltage. Therefore, this invention can simultaneously fabricate single-level EEPROM and the high/low voltage devices thereof, so this invention can reduce the complication and costs in the conventional process to correspond to economic effect. On the other hand, the single-level EEPROM of the present invention can be operated in the opposite electric field with wide range, wherein the high-voltage range utilized in the present invention is about 18V, such as −6V~12V, −12V~6V, −9V~9V etc. Furthermore, the devices fabricated by this invention can simultaneously input and output the positive/negative voltages without transforming voltage state, so this invention can support more diverse application field for the devices or products that need the positive/negative voltages to operate. Therefore, the method of the present invention is the best fabrication process of single-level EEPROM for deep sub-micron semiconductor process.

Obviously, many modifications and variations of the present invention are possible in light of the above teachings. It is to be understood that within the scope of the appended claims, the present invention may be practiced other than as specifically described herein.

Although the specific embodiments have been illustrated and described, it will be obvious to those skilled in the art that various modifications may be made without departing from what is intended to be limited solely by the appended claims.

What is claimed is:

1. A method for forming a single-level electrically erasable and programmable read only memory, the method comprising:

providing a semiconductor substrate having a first well and a second well;

defining and forming a plurality of isolation regions in the semiconductor substrate, and simultaneously, a first device region is formed in the first well, a second device region is formed adjacent said first well, a third device region is formed between said second well and said second device region and a fourth device region is formed in said second well;

forming a first dielectric layer having a first thickness on said semiconductor substrate;

performing an ion-implanting process to form a control gate in said second device region under said first dielectric layer;

removing [a portion of] said first dielectric layer located on said semiconductor substrate of said first well and said second well;

forming a second dielectric layer having a second thickness on [a remaining portion of said first dielectric layer] *said semiconductor substrate* located on said first well and said second well;

removing [a portion of] said second dielectric layer located on said fourth device region;

forming a third dielectric layer having a third thickness on said first device region, said second device region and said fourth device region, wherein said third dielectric layer and said second dielectric layer are stacked from each other to form a fourth dielectric layer having a fourth thickness on said first device region; and further, said third dielectric layer and said first dielectric layer are stacked from each other to form a fifth dielectric layer having a fifth thickness on said second device region; and forming and defining a plurality of gates on these dielectric layers of said first device region, said second device region, said third device region and said fourth device region, wherein there is the same gate located on said first device region and said second device region, which serves as the floating gate.

2. The method according to claim 1, wherein said first dielectric layer is a high-voltage dielectric layer.

3. The method according to claim 1, wherein said second thickness is [about] less than said first thickness.

4. The method according to claim 1, wherein said third dielectric layer is a low-voltage dielectric layer.

5. The method according to claim 1, wherein said third thickness is [about] less than the second thickness.

6. The method according to claim 1, wherein said fifth thickness of said fifth dielectric layer on said second device region is more than said first thickness of said first dielectric layer on said third device region; and further, said first thickness of said first dielectric layer on said third device region is more than said fourth thickness of said fourth dielectric layer on said first device region; and further, said fourth thickness of said fourth dielectric layer on said first device region is more than said third thickness of said third dielectric layer on said fourth device region.

7. The method according to claim 1, wherein the first part of said floating gate is located on the dielectric layer of said first device region and the second part of said floating gate is located on the dielectric layer of said second device region.

8. The method according to claim 1, wherein said third device region can be operated in the opposite electric field about 18V.

9. The method according to claim 8, wherein the opposite electric field comprises the range −6V to 12V, −12V to 6V and −9V to 9V.

* * * * *